(12) United States Patent
Jonsson (10) Patent No.: US 8,761,317 B2
(45) Date of Patent: Jun. 24, 2014

(54) SOFT-BIT GENERATION AND CHANNEL ESTIMATION FOR INTERFERENCE CANCELLATION USING DECODER OUTPUT

(75) Inventor: Elias Jonsson, Malmö (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/439,357

(22) Filed: Apr. 4, 2012

(65) Prior Publication Data

US 2013/0266095 A1   Oct. 10, 2013

(51) Int. Cl.
*H04L 27/06* (2006.01)

(52) U.S. Cl.
USPC ........... 375/341; 375/262; 375/316; 375/346; 455/63.1; 455/67.13; 455/114.2; 455/296; 455/501; 370/335; 370/342; 714/794; 714/795; 714/796; 327/551

(58) Field of Classification Search
USPC ................. 375/262, 316, 341, 346; 455/63.1, 455/67.13, 114.2, 296, 501; 370/335, 342; 714/794, 795, 796; 327/551
See application file for complete search history.

(56) References Cited

U.S. PATENT DOCUMENTS

| 7,668,125 | B2 * | 2/2010 | Kadous | 370/310 |
| 7,701,917 | B2 * | 4/2010 | Mantravadi et al. | 370/343 |
| 7,724,838 | B2 * | 5/2010 | Mantravadi | 375/295 |

FOREIGN PATENT DOCUMENTS

| EP | 1641135 A1 | 3/2006 |
| GB | 2398979 A | 9/2004 |
| WO | 2006030314 A1 | 3/2006 |
| WO | 2007073315 A2 | 6/2007 |

OTHER PUBLICATIONS

Kaiser, S. et al. "Multi-Carrier CDMA with Iterative Decoding and Soft-Interference Cancellation." IEEE 1997.

\* cited by examiner

*Primary Examiner* — Leon Flores
(74) *Attorney, Agent, or Firm* — Murphy, Bilak & Homiller, PLLC (57) ABSTRACT

Log-likelihood ratios produced by a decoder are incorporated into a soft symbol to soft bit estimation process and are used to perform improved channel estimation and impairment covariance estimation. In an example method, a plurality of soft bits and corresponding probability metrics for a series of received unknown symbols are generated. Estimates of the received unknown information symbols are then regenerated, as a function of the soft bits and corresponding probability metrics. An estimate of the average amplitude of the received unknown information symbols, or an estimate of the propagation channel response experienced by the received unknown information symbols, or both, are calculated, as a function of the regenerated symbol estimates. The results are applied to produce demodulated symbols for a second decoding iteration for the series of received unknown symbols.

28 Claims, 5 Drawing Sheets

SOFT-BIT GENERATION AND CHANNEL ESTIMATION FOR INTERFERENCE CANCELLATION USING DECODER OUTPUT

BACKGROUND

The present invention generally relates to wireless communications receivers, and more particularly relates to techniques for improving receiver processing using probability metrics associated with demodulated soft bits.

In today's advanced wireless systems, both the uplink (mobile terminal-to-base station communications) and downlink (base station-to-mobile terminal communications are subject to various sources of interference, including, for example, intra-cell interference arising from a lack of complete orthogonality between user signals within a wireless system cell, inter-cell interference arising from signals intended for users or originating from users in other cells, and thermal noise. To combat these interference sources, interference cancellation techniques are increasingly being deployed.

One category of interference cancellation techniques is known as decoder interference cancellation (IC) or post-decoder interference cancellation. The general idea behind decoder interference cancellation is that a signal generated using decoder output from a first decoding attempt is subtracted from the input signal before a second decoding attempt. The decoder output from the first decoding attempt could relate to a signal that is an ultimate target of the demodulation/detection process, or it might represent decoded bits of an unwanted signal, for the purpose of cancellation.

Figure 1:
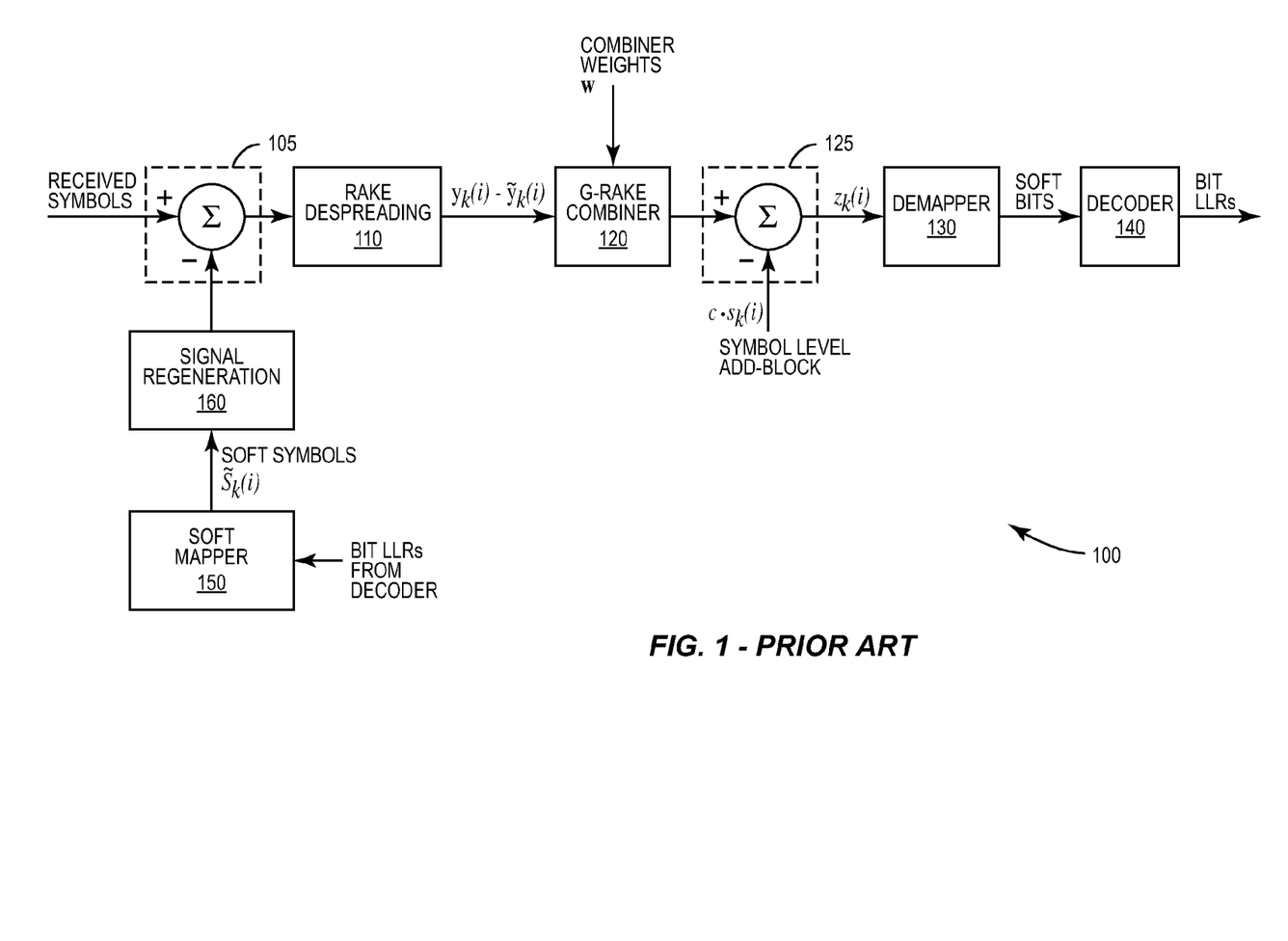
FIG. 1 is a block diagram illustrating an example interference cancelling receiver.

FIG. 1 illustrates an example of an interference cancelling receiver 100 that uses output from the decoder to perform interference cancellation. This receiver system is sometimes referred to as a Turbo interference cancellation receiver. In the figure, a so-called RAKE receiver is shown, which indicates a Wideband Code-Division Multiple Access (W-CDMA) application of decoder interference cancellation. However, the general structure works equally well for Long-Term Evolution (LTE) applications, which are based on Orthogonal Frequency-Division Multiple Access (OFDMA), if the RAKE components are replaced with Fast-Fourier-Transform (FFT)-based receiver components.

As can be seen in FIG. 1, the output of the decoder 140 produces log-likelihood ratios (LLR), which are essentially estimated probabilities that the corresponding decoded information bits should be set to one or zero. For interference cancellation purposes, the LLRs are used by soft mapper 150 to generate the symbol values that were most likely to have been transmitted by another node, such as a base station when the receiver is in a wireless terminal. An estimate of the received signal corresponding to these symbol values is produced by signal regenerator 160, which applies the same modulation and scrambling that was removed from the signal by RAKE despreader 110 and demapper 130 in the first decoding iteration. Then, the regenerated signal from signal regenerator 160 is subtracted from the original input signal, using subtracter 105, to produce an interference-reduced signal. At the output of the RAKE despreader 110, the contribution to the despread signal from the original received signal (for a given code) is denoted $y_k(i)$ and the contribution from the subtracted signal is denoted as $\tilde{y}_k(i)$, where i is the symbol index and k the channelization code.

An equalizer, illustrated as a G-RAKE combiner 120 in FIG. 1, applies equalizer weights to the despread signal to reduce the effects of multipath propagation. The equalizer weights, or G-RAKE weights, since the weights are applied after the RAKE, are denoted w.

Before demapping of the interference-reduced and equalized signal, that is, before conversion from soft symbols to soft bits, the earlier subtracted signal is added back, in the event that the subtracted signal is the signal we want to decode. In FIG. 1 this is denoted by $c \cdot \hat{s}_k(i)$, which is added to the G-RAKE combiner output by adder 125. Here, the scaling constant c is a function of the equalizer weights and the net channel estimates. It should be noted that if the subtracted sequence represents the decoded symbols from an interfering cell, the subtracted signal is not added back prior to the demapping by demapper 130. Add back is only done the event that the signal that we are interested in demodulating has been subtracted.

In either case, after demapping by demapper 130, decoding is performed by decoder 140, which produces a new (and improved) set of probabilities (LLR) for the transmitted bits. The above procedure could be repeated as many times as desired, subject to limitations on processing power available in the receiver, limitations on latency, etc. Of course, this iterative process might also be terminated when the remaining errors in the decoded bits fall below a target level.

Intra-cell and inter-cell interference have a fundamental impact on the maximum throughput of a wireless communication system. While previously described interference cancellation schemes help, further improvements are needed.

SUMMARY

In several embodiments of the present invention, the probability information developed in an iterative decoder is more fully exploited, to obtain improved receiver performance. More particularly, in several of the techniques described in detail below, the log-likelihood ratios (LLRs) produced by a decoder are incorporated into the soft symbol to soft bit estimation process and are used to perform improved channel estimation and impairment covariance estimation.

The techniques described in detail below include several methods for processing a received signal containing a series of unknown information symbols. An example method, suitable for implementation by a communications receiver, begins with generating a plurality of soft bits and corresponding probability metrics for a first decoding iteration, where the plurality of soft bits corresponding to the series of received unknown information symbols. Estimates of the received unknown information symbols are then regenerated, as a function of the soft bits and corresponding probability metrics. Next, an estimate of the average amplitude of the received unknown information symbols, or an estimate of the propagation channel response experienced by the received unknown information symbols, or both, are calculated, as a function of the regenerated estimates of the received unknown information symbols. Finally, the calculated estimate of the average amplitude of the received unknown information symbols, or the estimate of the propagation channel response, or both, are applied to produce demodulated symbols for a second decoding iteration for the series of received unknown information symbols.

In some embodiments, the probability metrics are log-likelihood ratios for the soft bits. In some embodiments, either or both of the two calculations summarized above are further based on received pilot symbols.

Several variants of the calculations are possible. For instance, in some embodiments, calculating the estimate of the average amplitude of the received unknown information symbols, or calculating the estimate of the propagation channel response experienced by the received unknown information symbols, or both, begins with the computing of a variance for each of the regenerated estimates of the received unknown information symbols, from the probability metrics for the soft bits that correspond to each regenerated estimate. The estimate of the average amplitude of the received unknown information symbols, or the estimate of the propagation channel response experienced by the received unknown information symbols, or both, are then calculated using only those of the regenerated estimates having variances below a predetermined threshold. In another variant, calculating the estimate of the average amplitude of the received unknown information symbols, or calculating the estimate of the propagation channel response experienced by the received unknown information symbols, or both, begins with the computation of, for each of the regenerated estimates of the received unknown information symbols, a probability that the regenerated estimate is equal to a most likely one of possible transmitted symbol values. The estimate of the average amplitude of the received unknown information symbols, or the estimate of the propagation channel response experienced by the received unknown information symbols, or both, are then calculated using only those of the regenerated estimates having a computed probability above a predetermined threshold.

In still other embodiments, calculating the estimate of the average amplitude of the received unknown information symbols, or calculating the estimate of the propagation channel response experienced by the received unknown information symbols, or both, begins with computing a variance for each of the regenerated estimates of the received unknown information symbols, from the probability metrics for the soft bits that correspond to each regenerated estimate. An amplitude-restoring scaling factor is computed, as a function of the computed variances, wherein high variances yield a higher scaling factor than low variances. Then, the estimate of the average amplitude of the received unknown information symbols, or the estimate of the propagation channel response experienced by the received unknown information symbols, or both, are calculated as a function of the scaling factor and the regenerated estimates of the received unknown information symbols.

The methods summarized above may be extended to other receiver processes, as well. For example, any of the methods summarized above can be extended to further include the calculation of a signal impairment covariance matrix as a function of the calculated estimate of the propagation channel response. In some cases, this calculating of an impairment covariance matrix comprises averaging, over time, matrices formed by computing covariances between pairs of channel sample vectors formed from the regenerated symbols, relative to a denoised channel estimate, where each of the matrices is weighted by weighting factors for each of the channel sample vectors in the corresponding pair, and where each weighting factor varies in the opposite direction of the variance of the regenerated symbol used to generate the corresponding channel sample vector.

Embodiments of the present invention further include receiver circuits configured to carry out one or more of the methods described above. For example, a communications receiver apparatus according to several embodiments of the invention includes a symbol demapping and decoder circuit configured to, in a first decoding iteration for a series of received unknown information symbols, generate a plurality of soft bits and corresponding probability metrics, the plurality of soft bits corresponding to the series of received unknown information symbols, as well as a symbol regeneration circuit configured to regenerate estimates of the received unknown information symbols as a function of the soft bits and corresponding probability metrics. The communications receiver apparatus further includes a channel estimation circuit, which is configured to calculate an estimate of the average amplitude of the received unknown information symbols or to calculate an estimate of the propagation channel response experienced by the received unknown information symbols, or both, as a function of the regenerated estimates of the received unknown information symbol. Finally, the communications receiver apparatus includes a demodulation circuit configured to apply the calculated estimate of the average amplitude of the received unknown information symbols, or the estimate of the propagation channel response, or both, to produce demodulated symbols for a second decoding iteration for the series of received unknown information symbols. Any of the several variants of the calculations summarized above and described in detail below may be used by this communications receiver apparatus. Further, the communication receiver apparatus may be included in one or more nodes of a communication link. In general, a base station (e.g., a "NodeB") and a wireless terminal (e.g., a "UE") may be considered as examples of respective different nodes or communications devices.

The methods and circuits summarized above can provide improved demodulation performance compared to prior techniques. Of course, the present invention is not limited to the above-summarized features and advantages. Indeed, those skilled in the art will recognize additional features and advantages upon reading the following detailed description, and upon viewing the accompanying drawings.

DETAILED DESCRIPTION

The invention is described more fully hereinafter with reference to the accompanying drawings, in which examples of embodiments of the invention are shown. This invention may, however, be embodied in many different forms and should not be construed as limited to the embodiments set forth herein. It should also be noted that these embodiments are not mutually exclusive. Thus, components or features from one embodiment may be assumed to be present or used in another embodiment, where such inclusion is suitable.

For purposes of illustration and explanation only, these and other embodiments of the present invention are described herein in the context of operating in a radio access network (RAN) that communicates over radio communication channels with wireless terminals (also referred to as user equipment, or "UEs"). More particularly, specific embodiments are described in the context of systems using Wideband Code-Division Multiple Access (W-CDMA) technology and/or High-Speed Downlink Packet Access (HSDPA) technology, as standardized by the membership of the 3$^{rd}$ Generation Partnership Project (3GPP). It will be understood, however, that the present invention is not limited to such embodiments and may be embodied generally in various types of communication networks. As used herein, the terms mobile terminal, wireless terminal, or UE can refer to any device that receives data from a communication network, and may include, but are not limited to, a mobile telephone ("cellular" telephone), laptop/portable computer, pocket computer, hand-held computer, and/or desktop computer.

Also note that the use of terminology such as "base station" (which may be referred to in various contexts as NodeB, eNodeB, or Evolved Node B) and "wireless terminal" or "wireless device" (often referred to as "UE" or "User Equipment") should be considering non-limiting and does not necessarily imply a certain hierarchical relation between two particular nodes of a communication link. In general, a base station (e.g., a "NodeB") and a wireless terminal (e.g., a "UE") may be considered as examples of respective different communications devices that communicate with each other over a wireless radio channel. While embodiments discussed herein may focus on wireless transmissions in a downlink from a NodeB to a UE, embodiments of the invention may also be applied, for example, in the uplink.

As suggested above, the suppression and/or removal of interfering signals is fundamental to improving the coverage and throughput of advanced wireless systems. While several interference cancellation techniques have been developed, improvements are needed. One problem with previously disclosed approaches is that they do not fully exploit the probability information developed in an iterative decoder. More particularly, these techniques do not adequately incorporate the log-likelihood ratios (LLRs) produced by the decoder into the soft symbol to soft bit estimation process. Further, these techniques do not take full advantage of the LLR information in performing channel estimation and impairment covariance estimation.

Before the details of the present invention are fully described, a few background processes that are common to many advanced wireless receiver processes are discussed. Then, improvements and extensions to these background processes, enabled by the present invention, are described in detail.

First, it is often necessary, such as for demodulation purposes, for a receiver to estimate the average magnitude of received soft symbols. For instance, when converting soft symbols to soft bits, a receiver needs to know the magnitude of the soft symbols to properly establish the decision boundaries used to distinguish one soft symbol value from another. For example, for a High-Speed Physical Downlink Shared Channel (HS-PDSCH), transmitted on channelization code k, the average amplitude $d^{(k)}(n_s)$ over a slot of 160 symbols can be calculated according to:

$$d^{(k)}(n_s) = \frac{1}{2 \times 160} \sum_{i=0}^{159} (|\text{Re} z_k(k)| + |\text{Im} z_k(k)|), \quad (1)$$

where the index i enumerates the symbols in time, $z_k(i)$ is the combined symbol, and $n_s$ is the slot number. Further filtering of the average amplitude $d^{(k)}(n_s)$ is also possible, both in time and across channelization codes that are known to be transmitted with the same data amplitude.

Using the output probabilities from the decoder (e.g., LLRs), denote with $p_b$ the probability for a given bit to be of value b. Here b equals 1 or 0. Let s be a complex symbol consisting of two, four, or six bits, depending on modulation. Let b(s,i) be the value (1 or 0) of bit i in symbol s. Then, $P_{b(s,i)}$ is the probability for bit i in symbol s to equal b(s,i). The estimated value $\tilde{s}$ of a given transmitted symbol can be found by weighting with the probabilities for different symbol values. That is, $$\tilde{s} = \sum_{s \in C_{set}} p_{b(s)} s, \quad (2)$$

Here, $P_{b(s)}$ is the probability that the transmitted symbol was s. For 16QAM modulation, for example, $P_b(s) = P_{b(s,1)} \cdot P_{b(s,2)} \cdot P_{b(s,3)} \cdot P_{b(s,4)}$. The set of transmitted constellation symbols is given by $C_{set}$. For 16QAM the size of the set $C_{set}$ is 16. $|C_{set}|$ refers to the size of the set $C_{set}$, thus for 16QAM, $|C_{set}|=16$.

The bit probabilities $p_{b(s,i)}$ can also be used to compute the variance $\sigma^2$ of the estimated symbol $\tilde{s}$, which represents the deviation between $\tilde{s}$ and the probability weighted constellation points. That is:

$$\sigma^2 = \sum_{s \in C_{set}} p_{b(s)} |s - \tilde{s}|^2. \quad (3)$$

Note that both $\tilde{s}$ and $\sigma^2$ can be efficiently computed using symmetries of the constellation points and symbol probabilities built up using a product of bit values.

Two special cases should be noted for the symbol variance calculation given by Equation (3). In the first special case, the value of the transmitted symbol is known, which is the case for pilot symbols. In this case, only one $P_{b(s)}$, corresponding to the actually transmitted constellation point, equals one, while the rest equal zero. Thus, $\tilde{s}$ equals exactly the transmitted symbol and $\sigma^2$ equals zero. The second case is effectively the opposite case, where all $P_{b(s)}$ are equal, indicating that all constellation points are equally likely. Here, $\tilde{s}$ equals zero, and $\sigma^2$ equals one, assuming the energy of the transmitted symbol is normalized to one.

The impairment covariance matrix is very often an essential building block for the equalizer weights. The covariance corresponding to fingers $f_1$ and $f_2$ is computed by correlating samples of the type:

$$(h_{f_1,s} - h_{f_1}) \cdot (h_{f_2,s} - h_{f_2})$$

and averaging over a sufficient amount of time. Here, $h_{f_1,s}$ is a channel sample, that is, before de-noising, i.e., removal of noise. $h_{f_1}$ is a de-noised channel estimate. Note that in W-CDMA the meaning of finger refers to a combination of receiver antenna and time delay. In LTE, a finger refers to a particular receiver antenna. In the remaining description, notation pertaining to WCDMA is used, since LTE will be a special case of the WCDMA notation.

Collecting all $h_{f_1,s}$ into a column vector $h_s$ and similarly for $h_{f_1}$ we can write an impairment covariance sample matrix as:

$$R_s = (h_s - h)(h_s - h)^H. \quad (4)$$

Using the same notation used in FIG. 1, the channel samples are given by:

$$h_{s,k}(i) = y_k(i)/p. \quad (5)$$

Here, p is a known transmitted symbol (pilot) and $y_k(i)$ is the RAKE despread symbol for channelization code k and the symbol index i that corresponds to the transmitted pilot. Here, $y_k(i)$ is a vector over the several fingers allocated to channelization code k. The de-noised, i.e., averaged and/or filtered, values h are usually a linear combination of the samples, where the number of samples used in the linear combination may depend on the Doppler spread. In W-CDMA the pilot is typically given by the Common Pilot Channel (CPICH), and the impairment covariance sample matrix is computed over one CPICH symbol. For example, an impairment covariance matrix R can then be computed by averaging, over time, several impairment covariance sample matrices $R_s$.

A general problem with an equalizer based on a impairment covariance matrix as described above is that the amount of noise, or uncertainty, in the matrix elements of the impairment covariance matrix R may be quite high due to a limited amount of samples. The techniques described herein can be used to improve channel estimation and to improve covariance estimation, as well as to improve soft bit generation via improved estimation of soft symbol amplitude in the presence of interference and noise. These techniques are based on the better use of probability metrics (e.g., LLRs) from a decoder iteration in subsequent iterations. More particularly, several of these techniques are based on the use of a variance computed for each of several regenerated unknown information symbols, from the probability metrics for the corresponding soft bits.

Figure 2:
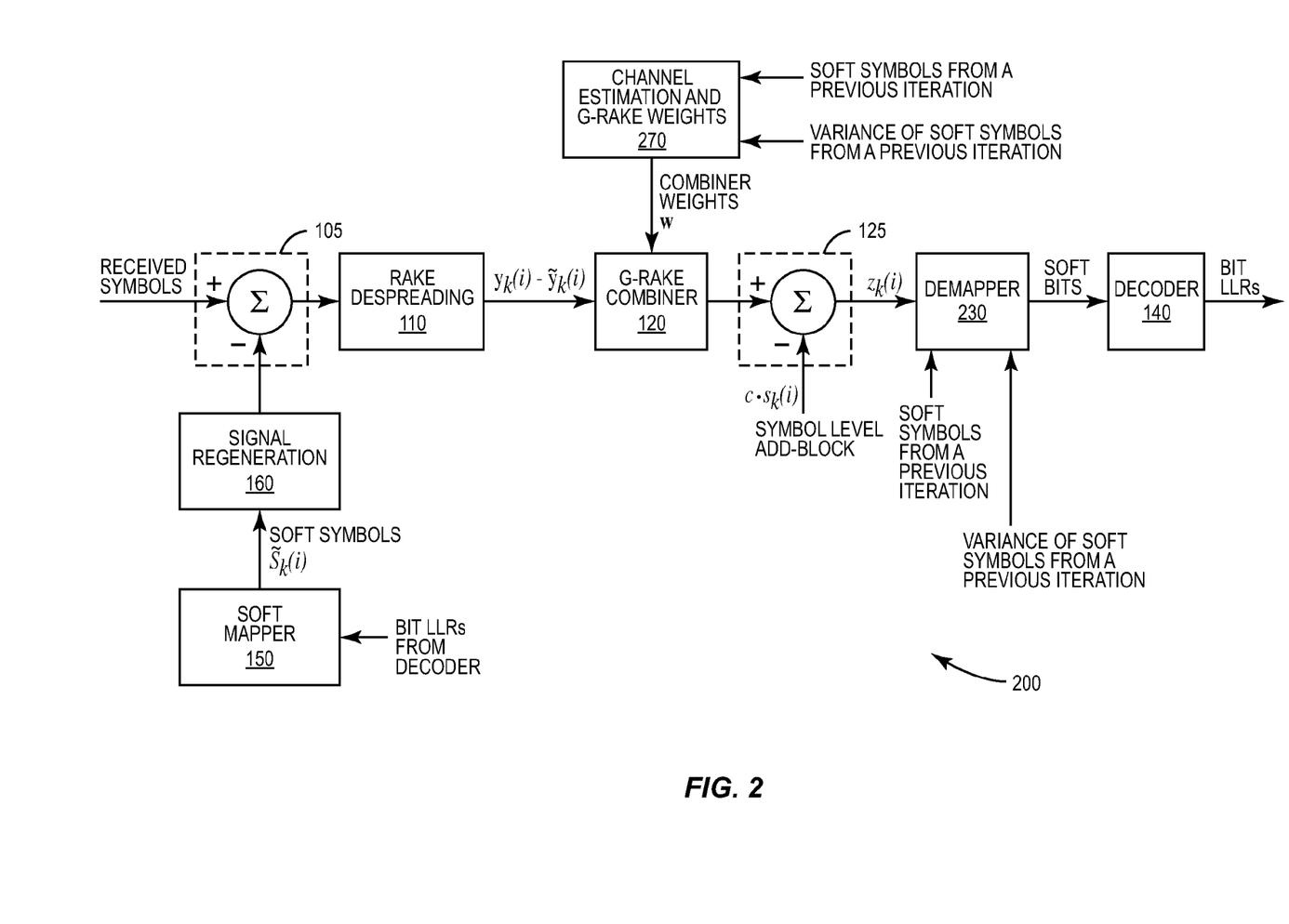
FIG. 2 is another block diagram illustrating an interference cancelling receiver configured according to some embodiments of the present invention.

The following description is divided into three parts, describing the incorporation of LLR decoder output for channel estimation, soft bit generation, and covariance estimation, respectively. FIG. 2 illustrates a schematic view of an example Turbo interference cancelling receiver 200 adapted to carry out the described techniques, and in particular illustrates the signals and receiver components involved in those techniques. It will be appreciated that several of the functional elements of the receiver of FIG. 2 are very similar to their corresponding elements in the receiver illustrated in FIG. 1, while several have been modified to calculate and/or to utilize the symbol variance information, as described below. In particular, demapper 230 incorporates soft symbols from a previous iteration, as well as the variances of those soft symbols, to produce an improved symbol amplitude estimation, which in turn improves the quality of the demapping process. Channel estimator and weight calculator 270 likewise incorporates this information into the channel estimation and covariance estimation processes.

Before proceeding with a detailed description of improved techniques for calculating channel estimates, symbol amplitude, and impairment covariance, channel samples are defined in vector notation, relative to a sequence of symbol vectors $y_k(i)$ for a given code k, as:

$$h_{s,k}(i) = y_k(i)/\tilde{s}_k(i). \quad (6)$$

Here, $\tilde{s}_k(i)$ can be pilot symbols, having known values, or soft regenerated symbols, representing a current best estimate of the symbols as received, or a combination. Given that $\sigma_k^2(i)$ is the corresponding variance (which is zero for pilot symbols), at least three kinds of intermediate channel estimates, based on the channel samples, can be defined:

$$h = \frac{1}{|S|} \sum_{(i,k) \in S} h_{s,k}(i); \quad (7)$$

$$h = \frac{1}{|S_t|} \sum_{(i,k) \in S_t} h_{s,k}(i); \quad (8)$$

$$h = \left( \sum_{(i,k) \in S} \sqrt{1 - \sigma_k^2(i)} \right)^{-1} \sum_{(i,k) \in S} h_{s,k}(i). \quad (9)$$

Here, the set S contains the set of symbols i and channelization codes k over which we want to average the channel response. The size of the set S could change depending on, for example, the Doppler. The set $S_t$, which appears in Equation (8), can be defined as the sub-set of samples S where the variance, that is, the variance of the corresponding soft symbol, is less than t:

$$S_t = \{(i,k) \in S; \sigma_k^2(i) \leq t\}. \quad (10)$$

This means that if t is close to zero, then a symbol and channelization code combination (i,k) in the set $S_t$ points to a very reliable estimate of the corresponding soft symbol. An alternative definition of $S_t$ is given by $$S_t = \left\{ (i,k) \in S; \max_{s \in C_{set}} p_{b(s)} \geq (1-t) \right\}. \quad (11)$$

This can be seen as selecting the soft symbols for which the probability of the most likely constellation symbol is larger than 1−t.

In Equation (9), the purpose of the first factor is to scale for the fact that the soft symbols $\tilde{s}_k(i)$ are not of the correct amplitude. Thus, the factor $$\left( \sum_{(i,k) \in S} \sqrt{1 - \sigma_k^2(i)} \right)^{-1}$$

can be viewed as an "amplitude-restoring" factor. While Equation (9) incorporates more of the available information, the formulation of Equation (8) can be more robust under certain conditions. In some conditions, for example, Equation (9) with t=0.5 is particularly effective.

Reviewing the intermediate channel estimates given by Equations (7), (8), and (9), it can be seen that Equation (7) represents an average channel response over a set of symbols S, while Equation (8) represents an average channel response over a subset $S_t$ of S, where the members of $S_t$ are those regenerated symbols that are most reliable. Thus, the improved channel estimate produced by Equation (8) more fully takes into account the probability information generated by a preceding decoder iteration. Equation (9), on the other hand, describes intermediate channel estimates where all of the pilots and/or regenerated symbols are used, but where the intermediate channel estimate is scaled using a term that incorporates the reliability of each symbol, as reflected by their variances. While Equation (9) uses all of the symbols in the set S, and thus can be viewed as more fully exploiting all of the information, the formulation given by Equation (8) may be more robust in practice, particularly when the symbol variances themselves vary widely.

Improved Channel Estimation

Any of the vectors h described above could be used as a channel estimate directly. Alternatively, each could serve as an immediate input to a more elaborate channel estimator, such as a channel estimator that filters the estimation over time or over channelization codes. In the latter case, the set S at a given time should be selected so as to ensure that the propagation channel response stays constant over the set S, since more de-noising processing will follow. This could be a very small interval, such as one or two symbol times, in some cases, since an intermediate channel estimation in these cases can be viewed as simply an improved channel for subsequent channel estimation processing.

Provided that all of the samples in S or $S_t$ come from the same physical channel, with the same amplitude across the channelization codes used for their transmissions, the improved estimates given by Equations (8) and (9) ensure that the amplitude of h is of the same size as the amplitude of the physical channel. Such channel estimates are useful when trying to estimate impairment covariances, as will be seen below.

Soft Bit Generation

An important part of the soft symbol to soft bit generation process, e.g., as performed by demapper 230 in the receiver of FIG. 2, is knowledge of the amplitude of the soft symbols. Equation (1), given above, gives an example of one approach to estimating this amplitude. However, Equation (1) will fold received noise and interference into the amplitude estimation, since the absolute values of the real and imaginary parts of the equalized symbol $z_k(i)$ contain both signal and noise/interference. The result is that the averaging over the symbols will not be able to remove the folding of the noise and interference, which appears as a bias. I, Equation (1) frequently overestimates the true amplitude.

However, the amplitude estimation can be improved if soft symbol values are available. For example, both of the following represent improved estimations of the symbol amplitude:

$$d_{new} = \frac{1}{2|S_t|}\left(\left|\sum_{(i,k)\in S_t} \text{Re}(z_k(i)/\tilde{s}_k(i))\right| + \left|\sum_{(i,k)\in S_t} \text{Im}(z_k(i)/\tilde{s}_k(i))\right|\right) \quad (12)$$

or $$d_{new} = \left(2\sum_{(i,k)\in S} \sqrt{1-\sigma_k^2(i)}\right)^{-1} \left(\left|\sum_{(i,k)\in S} \text{Re}(z_k(i)/\tilde{s}_k(i))\right| + \left|\sum_{(i,k)\in S} \text{Im}(z_k(i)/\tilde{s}_k(i))\right|\right). \quad (13)$$

As was the case with the improved channel estimation formulations given above, both of these approaches to symbol amplitude estimation incorporate decoded soft symbols from a previous demodulation attempt, to enhance the accuracy of the amplitude estimation of the soft symbols. Note that these expressions are analogous to the improved channel estimation formulas given by Equations (8) and (9) where, for example, $S_t$ is a subset of the available regenerated symbols and/or pilots. It will also be appreciated that with these formulations, any noise part of the combined symbols $z_k(i)$ is effectively averaged before the absolute value is calculated. This reduces the influence of noise considerably on the amplitude estimate.

In Equation (13), the purpose of the first factor is to scale for the fact that the soft symbols $\tilde{s}_k(i)$ are not of the correct amplitude. Thus, the factor $$\left(2\sum_{(i,k)\in S} \sqrt{1-\sigma_k^2(i)}\right)^{-1}$$

can be viewed as an "amplitude-restoring" factor. While Equation (13) incorporates more of the available information, the formulation of Equation (12) can be more robust under certain conditions. In some conditions, for example, Equation (12) with t=0.5 is particularly effective. However, there must be a sufficient number of samples in the set $S_t$. If that number is less than about 50, for example, then the formulation of Equation (1) may be preferred, since there are then too few reliable samples available to generate a reliable amplitude estimate using either Equation (12) or (13).

Covariance Estimation

It was noted above that an accurate impairment covariance matrix is essential for a good equalizer. For a non-parametric equalizer, the lack of enough pilot symbols is a particular problem. By considering the soft symbols regenerated from the LLRs as additional pilots, the impairment covariance matrix estimation can be improved. The variance of the LLR is used to incorporate the quality of the soft symbols in the contribution to the buildup of the impairment covariance matrix.

For example, an impairment covariance matrix R can be computed by averaging, over time, sample impairment covariance matrices of the form:

$$R_s = \sqrt{1-\sigma_{k_1}^2(i_1)}\sqrt{1-\sigma_{k_2}^2(i_2)}(h_{s,k_1}(i_1)-h)(h_{s,k_2}(i_2)-h)^H. \quad (14)$$

Here, $h_{s,k_1}(i_1)$ is a column vector of the channel samples as in Equation (5). Each entry in the vector corresponds to a finger. Here, h is a de-noised channel estimate, i.e., a channel response estimate that has been filtered and/or averaged, such as one of the intermediate channel estimates given by Equations (8) and (9). Since the sample matrix involves the difference between two quantities, it is important that the amplitude of the de-noised channel estimates does not change. This is the reason for using Equation (8) or (9). Note that the first two factors in equation (14) give a clue to the quality of the impairment covariance matrix sample. If the variance is high, the corresponding impairment covariance matrix sample is small, which makes intuitive sense.

It should also be noted that if the impairment covariance matrix R is computed using soft symbols that have been canceled from the I/Q stream, the de-noised channel estimate h can be set to zero. This can be done, for example, when the detected residual power of the de-noised channel estimates is less than a certain threshold. However, if the soft symbols used in the impairment covariance matrix calculation are not cancelled, this feature is not of interest. A process in which the soft symbols from the I/Q stream are not cancelled and in which the impairment covariance matrix and the combiner weights are recomputed is of interest to improve upon the combiner weights.

As will be readily understood by those familiar with communications receiver design, the several functional blocks of receiver circuit 200, as well as corresponding functions in other receiver circuits using the inventive techniques described herein, may be implemented using digital logic and/or one or more microcontrollers, microprocessors, or other digital hardware. In some embodiments, several or all of the various functions of receiver circuit 200 may be implemented together, such as in a single application-specific integrated circuit (ASIC), or in two or more separate devices with appropriate hardware and/or software interfaces between them. Several of the functional blocks of receiver circuit 200, including, for example, demapper 230 and channel estimation and weight calculation circuit 270, may be implemented on a processor shared with other functional components of a wireless terminal, for example.

Alternatively, several of the functional elements of the receiver processing circuits discussed above may be provided through the use of dedicated hardware, while others are provided with hardware for executing software, in association with the appropriate software or firmware. Thus, the term "processor" or "controller" as used herein does not exclusively refer to hardware capable of executing software and may implicitly include, without limitation, digital signal processor (DSP) hardware, read-only memory (ROM) for storing software, random-access memory for storing software and/or program or application data, and non-volatile memory. Other hardware, conventional and/or custom, may also be included. Designers of communications receivers will appreciate the cost, performance, and maintenance tradeoffs inherent in these design choices.

Figure 3:
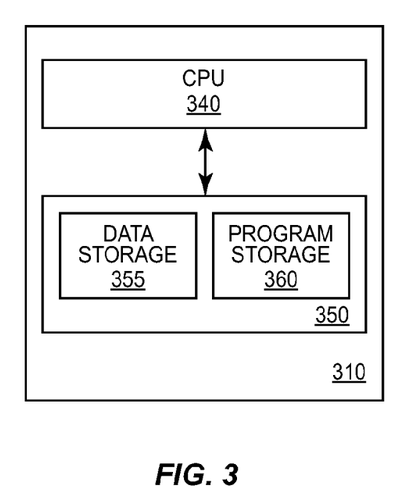
FIG. 3 illustrates an example processing circuit according to several embodiments of the present invention.

FIG. 3 illustrates one example of a processing circuit 310 adapted to carry out the functions of one or more of the functional blocks of receiver circuit 200, such as the demapper 230 and/or the channel estimation and weight calculation circuit 270. Processing circuit 310 includes a central-processing unit (CPU) 340, which may comprise one or more microprocessors, microcontrollers, and/or the like, coupled to memory unit 350. Memory unit 350, which may comprise one or several types of memory such as RAM, ROM, Flash, optical storage devices, magnetic storage devices, and the like, stores computer program instructions 360 for execution by CPU 340, and stores program data 355. Program instructions 360 include instructions for carrying out one or more of the techniques described above. In particular, program instructions 360 may include, in several embodiments, computer program instructions for estimating symbol amplitudes, channel response, and/or impairment covariance, using one of the detailed techniques described above or variants thereof. Thus, for example, the combination of CPU 340 with memory 350 forms a circuit configured to perform all or part of an iterative (Turbo) interference cancellation process in a communications receiver.

The processing circuit 310 of FIG. 3 may be further configured, in some embodiments, to carry out some or all of the functions of one or more of the other functional blocks of FIG. 2, such as decoder 140, soft mapper 150, signal regenerator 160, and so on. In some cases some or all of these functions may be carried out on separate processing circuits, which may or may not have similar structures. It will be appreciated, of course, that several of the functions of receiver circuit 200 may be better suited for implementation in specialized digital hardware. For example, hardware implementations of high-speed correlator arrays suitable for implementing RAKE despreader 110 are well known.

Figure 4:
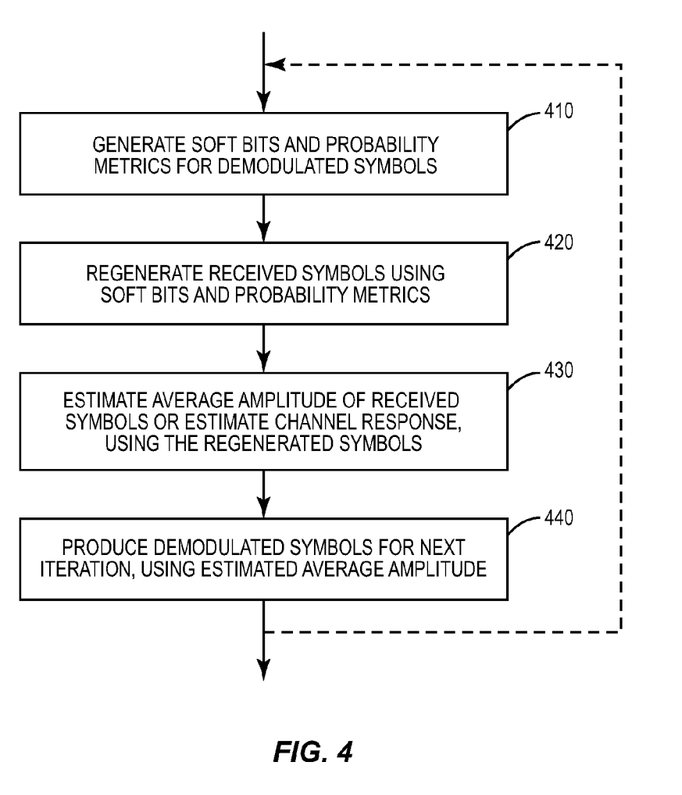
FIG. 4 is a process flow diagram illustrating an example method according to some embodiments of the present invention.

Those skilled in the art will appreciate that a receiver circuit that includes an processing circuit of the sort described above, can produce an improved estimate of the average amplitude (e.g., $d^{(k)}(n_s)$) of received unknown information symbols $s(i)$, or an improved estimate of the propagation channel response h experienced by the received unknown information symbols $s(i)$, or both. FIG. 4 illustrates an example method for implementation by such a receiver circuit.

The illustrated method begins, as shown at block 410, with the generation of soft bits and corresponding probability metrics for a series of received unknown symbols $s(i)$. The number of soft bits per symbol will depend, of course, on the modulation scheme. In many cases, the probability metrics are log-likelihood metrics, i.e., LLRs, produced by, for instance, a Turbo decoder.

As shown at block 420, the method continues with the feeding back of the soft bits and probability metrics to a signal regenerator, which regenerates estimates of the received unknown information symbols as a function of the soft bits and the corresponding probability metrics. Then, the regenerated estimates of the received information symbols are used to calculate an estimate of the average amplitude (e.g., $d^{(k)}(n_s)$) of the received information symbols, or to calculate an estimate of the propagation channel response h experienced by the received unknown information symbols, as shown in block 430. In many cases, both calculations are done. Finally, as shown at block 440, the calculated estimate of the symbol amplitude or the calculated channel response estimate is applied to produce demodulated symbols for a second decoding iteration for the series of received unknown information symbols. As indicated by the figure, the entire process may be repeated several times.

Several variations of the calculation of the average symbol amplitude or estimated channel response are possible. For example, in some cases this calculation is further based on received pilot symbols, in addition to the received unknown information symbols. As another example, in some embodiments, calculating the estimate of the average amplitude of the received unknown information symbols, or calculating the estimate of the propagation channel response experienced by the received unknown information symbols, or both, begins with the computation of a variance for each of the regenerated estimates of the received unknown information symbols, from the probability metrics for the soft bits that correspond to each regenerated estimate. An example of this calculation was given in Equation (3). The estimate of the average amplitude of the received unknown information symbols, or the estimate of the propagation channel response experienced by the received unknown information symbols, or both, is then calculated using only those of the regenerated estimates having variances below a predetermined threshold, as was shown, for example, in Equations (8) and (12). Alternatively, the set of regenerated estimates used in the calculation may include only those of the regenerated estimates where the probability that the regenerated estimate is equal to the most likely of the possible constellation points is greater than a predetermined threshold. (Compare Equations (10) and (11) to see two alternative expressions for determining the subset of regenerated estimates used in calculating the amplitude estimate and/or propagation channel response estimate.) In either case, the calculation of the average symbol amplitude or estimated channel response is improved by discarding the least reliable symbols.

In another variant, the calculation of the average amplitude of the symbols or the estimated propagation channel response likewise begins with computing a variance for each of the regenerated estimates of the received unknown information symbols, from the probability metrics for the soft bits that correspond to each regenerated estimate. (See Equation (3).) This variant continues, however, with the computing of an amplitude-restoring scaling factor according to a function of the computed variances whereby high variances yield a higher scaling factor than low variances. Examples of this amplitude-restoring scaling factor can be seen in Equations (9) and (13), which correspond to an average amplitude calculation and propagation channel response calculation, respectively. The estimate of the average amplitude of the received unknown information symbols or the estimate of the propagation channel response experienced by the received unknown information symbols (or both) is then calculated as a function of the scaling factor and the regenerated estimates of the received unknown information symbols.

Figure 5:
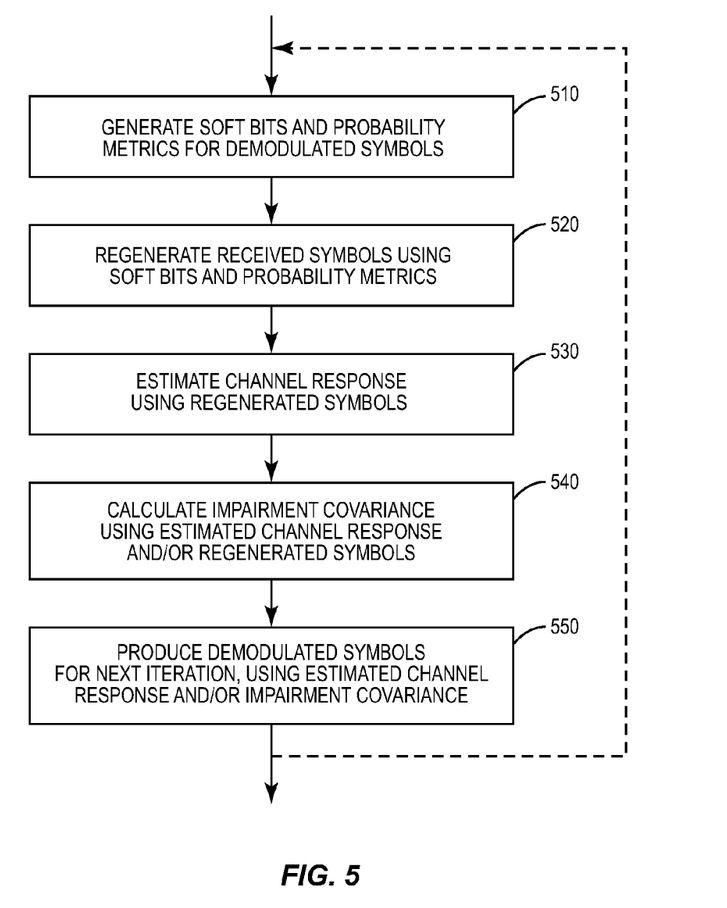
FIG. 5 is a process flow diagram illustrating another example method according to some embodiments of the present invention.

As discussed earlier, propagation channel estimates calculated according to the technique illustrated in FIG. 4 may be used to generated an improved impairment covariance matrix estimate R, which may then be used in a subsequent demodulation process, e.g., in forming equalizing combining weights as illustrated in the receiver circuit of FIG. 2. FIG. 5 illustrates a process flow corresponding to some embodiments of this approach.

The process illustrated in FIG. 5 begins the same way as the process of FIG. 4. Thus, blocks 510 and 520 correspond directly to blocks 410 and 420 of FIG. 4. However, since the focus of this process is the generation of a impairment covariance matrix R, block 530 illustrates only the calculation of an estimated propagation channel response experienced by the received unknown information symbols. Of course, this does not preclude an implementation in which the average amplitude of the received symbols is also calculated, using one or more of the techniques described above.

As shown at block 540, the illustrated process continues with the calculation of a signal impairment covariance matrix R as a function of the estimate of the propagation channel response. Equation (14) provides an example of this calculation. More generally, this calculation is based on averaging, over time, sample impairment covariance matrices $R_s$ formed by computing the covariances between pairs of channel sample vectors formed from the regenerated symbols, relative to a denoised channel estimate, where each of the matrices is weighted by weighting factors for each of the channel sample vectors in the corresponding pair, and where each weighting factor varies in the opposite direction of the variance of the regenerated symbol used to generate the corresponding channel sample vector. The calculated impairment covariance matrix R is then used, as shown at block 550, to produce demodulated symbols for a second decoding iteration for the series of received unknown information symbols. Once again, as indicated by the figure, the entire process may be repeated several times Embodiments of the present invention further include receiver circuits configured to carry out one or more of the methods described above. The receiver circuit 200 illustrated in FIG. 2 is one example of such a receiver circuit. More generally, a communications receiver apparatus according to several embodiments of the invention includes a symbol demapping and decoder circuit configured to, in a first decoding iteration for a series of received unknown information symbols, generate a plurality of soft bits and corresponding probability metrics, the plurality of soft bits corresponding to the series of received unknown information symbols, as well as a symbol regeneration circuit configured to regenerate estimates of the received unknown information symbols as a function of the soft bits and corresponding probability metrics. The communications receiver apparatus further includes a channel estimation circuit, which is configured to calculate an estimate of the average amplitude of the received unknown information symbols or to calculate an estimate of the propagation channel response experienced by the received unknown information symbols, or both, as a function of the regenerated estimates of the received unknown information symbol. This channel estimation circuit corresponds generally to channel estimator and weight calculator 270, as pictured in FIG. 2, and may be implemented, for example, using the circuit structure illustrated in FIG. 3. Finally, the communications receiver apparatus includes a demodulation circuit configured to apply the calculated estimate of the average amplitude of the received unknown information symbols, or the estimate of the propagation channel response, or both, to produce demodulated symbols for a second decoding iteration for the series of received unknown information symbols. The RAKE despreading circuit 110, G-RAKE combiner 120, and symbol demapper 230 illustrated in FIG. 2 represent one example of such a demodulation circuit, although it should be understood that the techniques described herein are not limited to implementation in RAKE receiver circuits. Any of the several variants of the calculations described earlier, including the several variants discussed in connection with FIGS. 4 and 5, may be used by this communications receiver apparatus.

It will be appreciated that the foregoing description and the accompanying drawings represent non-limiting examples of the methods and apparatus taught herein. As such, the inventive apparatus and techniques taught herein are not limited by the foregoing description and accompanying drawings. Instead, the present invention is limited only by the following claims and their legal equivalents.

What is claimed is:

1. A method, in a communications receiver, the method comprising:
   in a first decoding iteration for a series of received unknown information symbols, generating a plurality of soft bits and corresponding probability metrics, the plurality of soft bits corresponding to the series of received unknown information symbols;
   regenerating estimates of the received unknown information symbols as a function of the soft bits and corresponding probability metrics;
   calculating an estimate of the average amplitude of the received unknown information symbols, or calculating an estimate of the propagation channel response experienced by the received unknown information symbols, or both, as a function of the regenerated estimates of the received unknown information symbols;
   applying the calculated estimate of the average amplitude of the received unknown information symbols, or the estimate of the propagation channel response, or both, to produce demodulated symbols for a second decoding iteration for the series of received unknown information symbols.

2. The method of claim 1, wherein the probability metrics are log-likelihood ratios for the soft bits.

3. The method of claim 1, wherein calculating the estimate of the average amplitude of the received unknown information symbols, or calculating the estimate of the propagation channel response experienced by the received unknown information symbols, or both, comprises:
   computing a variance for each of the regenerated estimates of the received unknown information symbols, from the probability metrics for the soft bits that correspond to each regenerated estimate; and
   calculating the estimate of the average amplitude of the received unknown information symbols, or calculating the estimate of the propagation channel response experienced by the received unknown information symbols, or both, using only those of the regenerated estimates having variances below a predetermined threshold.

4. The method of claim 1, wherein calculating the estimate of the average amplitude of the received unknown information symbols, or calculating the estimate of the propagation channel response experienced by the received unknown information symbols, or both, comprises:
   computing, for each of the regenerated estimates of the received unknown information symbols, a probability that the regenerated estimate is equal to a most likely one of possible transmitted symbol values; and
   calculating the estimate of the average amplitude of the received unknown information symbols, or calculating the estimate of the propagation channel response experienced by the received unknown information symbols, or both, using only those of the regenerated estimates having a computed probability above a predetermined threshold.

5. The method of claim 1, wherein calculating the estimate of the average amplitude of the received unknown information symbols, or calculating the estimate of the propagation channel response experienced by the received unknown information symbols, or both, comprises computing a variance for each of the regenerated estimates of the received unknown information symbols, from the probability metrics for the soft bits that correspond to each regenerated estimate; and computing an amplitude-restoring scaling factor as a function of the computed variances, wherein high variances yield a higher scaling factor than low variances; and calculating the estimate of the average amplitude of the received unknown information symbols, or calculating the estimate of the propagation channel response experienced by the received unknown information symbols, or both, as a function of the scaling factor and the regenerated estimates of the received unknown information symbols.

6. The method of claim 5, wherein the amplitude-restoring scaling factor is inversely proportional to $$\sum_{i \in S} \sqrt{1 - \sigma_i^2},$$

where $\sigma_i^2$ is a normalized variance for each symbol i in the set S of regenerated estimates of the received unknown information symbols.

7. The method of claim 1, wherein calculating the estimate of the average amplitude of the received unknown information symbols, or calculating the estimate of the propagation channel response experienced by the received unknown information symbols, or both, is further based on received pilot symbols.

8. The method of claim 1, further comprising calculating a signal impairment covariance matrix as a function of the calculated estimate of the propagation channel response.

9. The method of claim 8, wherein calculating said signal impairment covariance matrix comprises averaging, over time, matrices formed by computing covariances between pairs of channel sample vectors formed from the regenerated symbols, relative to a denoised channel estimate, where each of the matrices is weighted by weighting factors for each of the channel sample vectors in the corresponding pair, and where each weighting factor varies in the opposite direction of the variance of the regenerated symbol used to generate the corresponding channel sample vector.

10. A communications receiver apparatus comprising:

a symbol demapping and decoder circuit configured to, in a first decoding iteration for a series of received unknown information symbols, generate a plurality of soft bits and corresponding probability metrics, the plurality of soft bits corresponding to the series of received unknown information symbols;

a symbol regeneration circuit configured to regenerate estimates of the received unknown information symbols as a function of the soft bits and corresponding probability metrics;

a channel estimation circuit configured to calculate an estimate of the average amplitude of the received unknown information symbols, or to calculate an estimate of the propagation channel response experienced by the received unknown information symbols, or both, as a function of the regenerated estimates of the received unknown information symbols; and a demodulation circuit configured to apply the calculated estimate of the average amplitude of the received unknown information symbols, or the estimate of the propagation channel response, or both, to produce demodulated symbols for a second decoding iteration for the series of received unknown information symbols.

11. The communications receiver apparatus of claim 10, wherein the probability metrics are log-likelihood ratios for the soft bits.

12. The communications receiver apparatus of claim 10, wherein the channel estimation circuit is configured to calculate the estimate of the average amplitude of the received unknown information symbols, or to calculate the estimate of the propagation channel response experienced by the received unknown information symbols, or both, by:

computing a variance for each of the regenerated estimates of the received unknown information symbols, from the probability metrics for the soft bits that correspond to each regenerated estimate; and calculating the estimate of the average amplitude of the received unknown information symbols, or calculating the estimate of the propagation channel response experienced by the received unknown information symbols, or both, using only those of the regenerated estimates having variances below a predetermined threshold.

13. The communications receiver apparatus of claim 10, wherein the channel estimation circuit is configured to calculate the estimate of the average amplitude of the received unknown information symbols, or to calculate the estimate of the propagation channel response experienced by the received unknown information symbols, or both, by:

computing, for each of the regenerated estimates of the received unknown information symbols, a probability that the regenerated estimate is equal to a most likely one of possible transmitted symbol values; and calculating the estimate of the average amplitude of the received unknown information symbols, or calculating the estimate of the propagation channel response experienced by the received unknown information symbols, or both, using only those of the regenerated estimates having a computed probability above a predetermined threshold.

14. The communications receiver apparatus of claim 10, wherein the channel estimation circuit is configured to calculate the estimate of the average amplitude of the received unknown information symbols, or to calculate the estimate of the propagation channel response experienced by the received unknown information symbols, or both, by:

computing a variance for each of the regenerated estimates of the received unknown information symbols, from the probability metrics for the soft bits that correspond to each regenerated estimate; and computing an amplitude-restoring scaling factor as a function of the computed variances, wherein high variances yield a higher scaling factor than low variances; and calculating the estimate of the average amplitude of the received unknown information symbols, or calculating the estimate of the propagation channel response experienced by the received unknown information symbols, or both, as a function of the scaling factor and the regenerated estimates of the received unknown information symbols.

15. The communications receiver apparatus of claim 14, wherein the amplitude-restoring scaling factor is inversely proportional to $$\sum_{i \in S} \sqrt{1 - \sigma_i^2},$$

where $\sigma_i^2$ is a normalized variance for each symbol i in the set S of regenerated estimates of the received unknown information symbols.

16. The communications receiver apparatus of claim 10, wherein the channel estimation circuit is configured to calculate the estimate of the average amplitude of the received unknown information symbols, or to calculate the estimate of the propagation channel response experienced by the received unknown information symbols, or both, based further on received pilot symbols.

17. The communications receiver apparatus of claim 10, wherein the channel estimation circuit is further configured to calculate a signal impairment covariance matrix as a function of the calculated estimate of the propagation channel response.

18. The communications receiver apparatus of claim 17, wherein the channel estimation circuit is configured to calculate said signal impairment covariance matrix by averaging, over time, matrices formed by computing covariances between pairs of channel sample vectors formed from the regenerated symbols, relative to a denoised channel estimate, where each of the matrices is weighted by weighting factors for each of the channel sample vectors in the corresponding pair, and where each weighting factor varies in the opposite direction of the variance of the regenerated symbol used to generate the corresponding channel sample vector.

19. A method, in a communications receiver, the method comprising:
    in a first decoding iteration for a series of received unknown information symbols, generating a plurality of soft bits and corresponding probability metrics, the plurality of soft bits corresponding to the series of received unknown information symbols;
    regenerating estimates of the received unknown information symbols as a function of the soft bits and corresponding probability metrics;
    calculating an estimate of the average amplitude of the received unknown information symbols, as a function of the regenerated estimates of the received unknown information symbols;
    applying the calculated estimate of the average amplitude of the received unknown information symbols, to produce demodulated symbols for a second decoding iteration for the series of received unknown information symbols.

20. The method of claim 19, wherein calculating the estimate of the average amplitude of the received unknown information symbols comprises:
    computing a variance for each of the regenerated estimates of the received unknown information symbols, from the probability metrics for the soft bits that correspond to each regenerated estimate; and
    calculating the estimate of the average amplitude of the received unknown information symbols using only those of the regenerated estimates having variances below a predetermined threshold.

21. The method of claim 19, wherein calculating the estimate of the average amplitude of the received unknown information symbols comprises:
    computing, for each of the regenerated estimates of the received unknown information symbols, a probability that the regenerated estimate is equal to a most likely one of possible transmitted symbol values; and
    calculating the estimate of the average amplitude of the received unknown information symbols using only those of the regenerated estimates having a computed probability above a predetermined threshold.

22. The method of claim 19, wherein calculating the estimate of the average amplitude of the received unknown information symbols comprises:
    computing a variance for each of the regenerated estimates of the received unknown information symbols, from the probability metrics for the soft bits that correspond to each regenerated estimate; and
    computing an amplitude-restoring scaling factor as a function of the computed variances, wherein high variances yield a higher scaling factor than low variances; and
    calculating the estimate of the average amplitude of the received unknown information symbols as a function of the scaling factor and the regenerated estimates of the received unknown information symbols.

23. The method of claim 22, wherein the amplitude-restoring scaling factor is inversely proportional to $$\sum_{i \in S} \sqrt{1 - \sigma_i^2},$$

where $\sigma_i^2$ is a normalized variance for each symbol i in the set S of regenerated estimates of the received unknown information symbols.

24. A communications receiver apparatus comprising:
    a symbol demapping and decoder circuit configured to, in a first decoding iteration for a series of received unknown information symbols, generate a plurality of soft bits and corresponding probability metrics, the plurality of soft bits corresponding to the series of received unknown information symbols;
    a symbol regeneration circuit configured to regenerate estimates of the received unknown information symbols as a function of the soft bits and corresponding probability metrics;
    a channel estimation circuit configured to calculate an estimate of the average amplitude of the received unknown information symbols, as a function of the regenerated estimates of the received unknown information symbols; and
    a demodulation circuit configured to apply the calculated estimate of the average amplitude of the received unknown information symbols to produce demodulated symbols for a second decoding iteration for the series of received unknown information symbols.

25. The communications receiver apparatus of claim 24, wherein the channel estimation circuit is configured to calculate the estimate of the average amplitude of the received unknown information symbols, or to calculate the estimate of the propagation channel response experienced by the received unknown information symbols, or both, by:
    computing a variance for each of the regenerated estimates of the received unknown information symbols, from the probability metrics for the soft bits that correspond to each regenerated estimate; and calculating the estimate of the average amplitude of the received unknown information symbols, using only those of the regenerated estimates having variances below a predetermined threshold.

26. The communications receiver apparatus of claim 24, wherein the channel estimation circuit is configured to calculate the estimate of the average amplitude of the received unknown information symbols by:
computing, for each of the regenerated estimates of the received unknown information symbols, a probability that the regenerated estimate is equal to a most likely one of possible transmitted symbol values; and
calculating the estimate of the average amplitude of the received unknown information symbols using only those of the regenerated estimates having a computed probability above a predetermined threshold.

27. The communications receiver apparatus of claim 24, wherein the channel estimation circuit is configured to calculate the estimate of the average amplitude of the received unknown information symbols by:
computing a variance for each of the regenerated estimates of the received unknown information symbols, from the probability metrics for the soft bits that correspond to each regenerated estimate; and
computing an amplitude-restoring scaling factor as a function of the computed variances, wherein high variances yield a higher scaling factor than low variances; and
calculating the estimate of the average amplitude of the received unknown information symbols as a function of the scaling factor and the regenerated estimates of the received unknown information symbols.

28. The communications receiver apparatus of claim 27, wherein the amplitude-restoring scaling factor is inversely proportional to $$\sum_{i \in S} \sqrt{1 - \sigma_i^2},$$

where $\sigma_i^2$ is a normalized variance for each symbol i in the set S of regenerated estimates of the received unknown information symbols.

* * * * *

UNITED STATES PATENT AND TRADEMARK OFFICE
CERTIFICATE OF CORRECTION

PATENT NO. : 8,761,317 B2
APPLICATION NO. : 13/439357
DATED : June 24, 2014
INVENTOR(S) : Jonsson It is certified that error appears in the above-identified patent and that said Letters Patent is hereby corrected as shown below:

In The Specification

In Column 5, Line 60, in Equation (1), delete "$(|\text{Re} z_k(k)| + |\text{Im} z_k(k)|),$" and insert -- $(|\text{Re } z_k(i)| + |\text{Im } z_k(i)|),$ --, therefor.

Signed and Sealed this
Thirteenth Day of January, 2015

Michelle K. Lee
*Deputy Director of the United States Patent and Trademark Office*